United States Patent
Tseng

(10) Patent No.: US 6,620,526 B1
(45) Date of Patent: Sep. 16, 2003

(54) METHOD OF MAKING A DUAL DAMASCENE WHEN MISALIGNMENT OCCURS

(76) Inventor: Horng-Huei Tseng, 5Fl., No. 25, Lane 281, Jungyang Rd., Hsinchu (TW), 300

(*) Notice: Subject to any disclaimer, the term of this patent is extended or adjusted under 35 U.S.C. 154(b) by 0 days.

(21) Appl. No.: 09/723,455

(22) Filed: Nov. 27, 2000

(51) Int. Cl.$^7$ ............................................. H01L 21/4763
(52) U.S. Cl. ........................ 428/637; 438/622; 438/618
(58) Field of Search ................................ 438/622, 618, 438/637, 628, 629, 639, 598; 257/758, 763

(56) References Cited

U.S. PATENT DOCUMENTS 5,466,636 A * 11/1995 Cronin et al. .............. 437/948
5,883,434 A * 3/1999 Noguchi .................... 257/750
6,348,733 B1 * 2/2002 Lin .......................... 257/758

* cited by examiner

*Primary Examiner*—Tom Thomas
*Assistant Examiner*—Douglas W. Owens
(74) *Attorney, Agent, or Firm*—Clement Cheng

(57) ABSTRACT

The method includes forming a trench in a first isolation layer. A sacrificial layer is formed along a surface of the etched substrate. A conductive layer is formed on the dielectric layer. A portion of the conductive layer is removed. A second isolation layer is formed on the first isolation layer and the conductive layer. An opening in the second isolation layer and the first isolation layer is formed. The sacrificial layer attached on the side wall of the conductive structure is removed via the opening, thereby forming a cavity adjacent to the conductive structure. Then, a conductive material is refilled in the cavity and the opening to connect to the conductive structure.

8 Claims, 4 Drawing Sheets

METHOD OF MAKING A DUAL DAMASCENE WHEN MISALIGNMENT OCCURS

FIELD OF THE INVENTION

The present invention relates to a method of fabricating integrated circuits, and specifically, to a method of the manufacture a dual damascene structure that may reduce the possibility of misalignment.

BACKGROUND OF THE INVENTION

The large integration of semiconductor ICs has been accomplished by a reduction in individual device size. As the integration level of semiconductor devices increases, each cell generally is reduced in size. To provide for such reduction in cell size, various techniques have been used to improve the performance of the device. For example, the cell capacitance of DRAM has been increased by increasing the effective area of a cell capacitor. To increase the capacitor's effective area, stacked-capacitor and trench-capacitor structures, as well as combinations thereof, have been developed. With this reduction of device size, many challenges arise in the manufacture of the ICs. Each device requires interconnections for exchanging electrical signals from one device to another device. Specially, the high performance integrated circuits have multi-level connections. Additional miniaturization is highly desirable for improved IC performance and cost reduction. Interconnects provide the electrical connections between the various electronic elements of an IC and they form the connections between these elements.

Many devices, such as DRAMs, include conductive lines for performing certain function and bit line contacts, storage node contacts formed in DRAM's unit cell. Thus, design rules for minimizing area and ensuring adequate process margin are required. A variety of techniques are employed to create interconnect lines and vias. One such technique involves a process generally referred to as dual damascene, which includes forming a trench and an underlying via hole. The trench and the via hole are simultaneous filled with a conductor material, thereby simultaneously forming an interconnect and an underlying plug. This is a preferred structure for low RC interconnect structures. Interconnect structures containing copper are typically fabricated by a Damascene process.

The prior art that relates to the field of the Dual Damascene process is disclosed in U.S. Pat. No. 6,140,226 to Grill, et al., entitled "Dual damascene processing for semiconductor chip interconnects." A further prior art may refer to U.S. Pat. No. 6,133,140 to Yu, et al., entitled "Method of manufacturing dual damascene utilizing anisotropic and isotropic properties".

One of the patents related to the dual damascene is disclosed in U.S. Pat. No. 6,077,770. First, as show in FIG. 1, a substrate structure 200 having a dielectric layer 202 formed thereon. Trenches 204a, 204b and 204c are formed in the dielectric layer 202. Next, as shown in FIG. 2, a layer of conductive material 206a', 206b', 206c' is deposited over the substrate 200 and is filled into the trenches 204a, 204b and 204c. Next, a portion of the conductive lines within the dielectric layer 202 is removed.

Next, as shown in FIG. 3, an insulation layer is formed over the dielectric layer 202. For example, the insulation layer can be a silicon nitride layer formed using, for example, a chemical vapor deposition method. Thereafter, a chemical-mechanical polishing (CMP) method is used to planarize the insulation layer until the dielectric layer 202 is exposed. Ultimately, cap layers 208a, 208b and 208c are formed within the respective trenches 204a, 204b and 204c above the conductive lines 206a', 206b' and 206c'. Another dielectric layer 212a is formed over the dielectric layer 202 and the cap layers 208a, 208b' and 208c, as shown in FIG. 3, an opening 214 in the dielectric layer 212a. Some time the misalignment situation will occurred, the opening 214 exposes the cap layer 208b. As shown in FIG. 3, only the side walls of the cap layer 208b and the conductive line 206b' are exposed.

Next, as shown in FIG. 4, the cap layer 208b above the conductive line 206b' is removed using a wet etching method. A cavity 216 is formed underneath the dielectric layer 212a. Next, as shown in FIG. 5, a glue/barrier layer 218 conformal to the surface of the opening 214 and the cavity 216 is deposited over the substrate 200. The glue/barrier layer 218 can be made from conductive material including titanium/titanium nitride (Ti/TiN) or tantalum/tantalum nitride (Ta/TaN). Thereafter, a conductive layer 220 is deposited over the substrate 200 by a chemical vapor deposition. Subsequently, an etching back or a chemical-mechanical polishing operation is carried out to remove excess conductive material above the dielectric layer 212a.

However, the method mentioned about has to laterally etch the nitride cap, and then laterally forming a material refilled into the trench 216. If the deposition condition is not good enough, it will result the conductive line opening that causes the yield drop or the resistance increases.

What is needed is a method of connecting the line under the misalignment for dual damascene.

SUMMARY OF THE INVENTION

The object of the present invention is to form a conductive plug when misalignment occurred for dual damascene.

A method for manufacturing a dual damascene structure comprises patterning a first isolation layer over a substrate. A trench is formed into the first isolation layer. A sacrificial layer is formed along a surface of the etched substrate. A conductive layer is formed on the dielectric layer. A portion of the conductive layer is removed, thereby forming a conductive structure in the trench.

A second isolation layer is formed on the first isolation layer and the conductive layer. An opening in the second isolation layer and the first isolation layer is formed, wherein the opening at least exposes a portion of the sacrificial layer attached on side wall of the conductive structure. The sacrificial layer attached on the side wall of the conductive structure is removed via the opening, thereby forming a cavity adjacent to the conductive structure. Then, a conductive material is refilled in the cavity and the opening to connect to the conductive structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a conductive line for interconnections by using dual damascene technique. It is appreciated that the present invention may be applied to any device. A method for manufacturing a conductive plug in a trench under misalignment situation to construct the conductive line.

Figure 1:
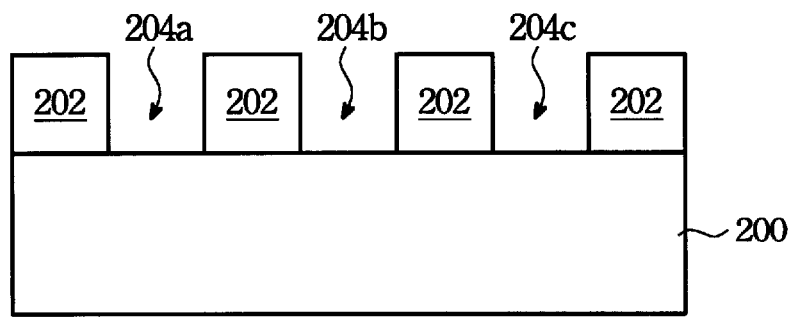
FIG. 1 is a cross sectional view of a semiconductor wafer illustrating the step of forming trenches in accordance with the prior art.
Figure 2:
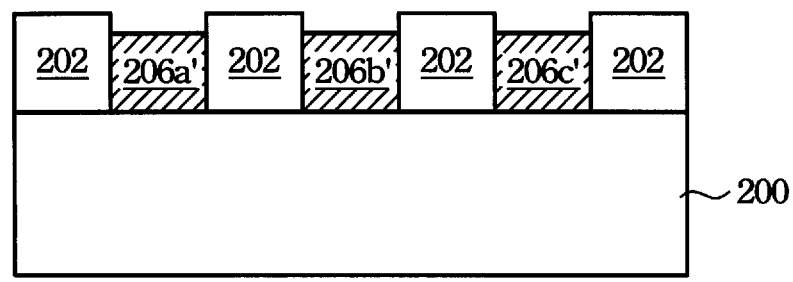
FIG. 2 is a cross sectional view of a semiconductor wafer illustrating the steps of forming a conductive material in accordance with the prior art.
Figure 3:
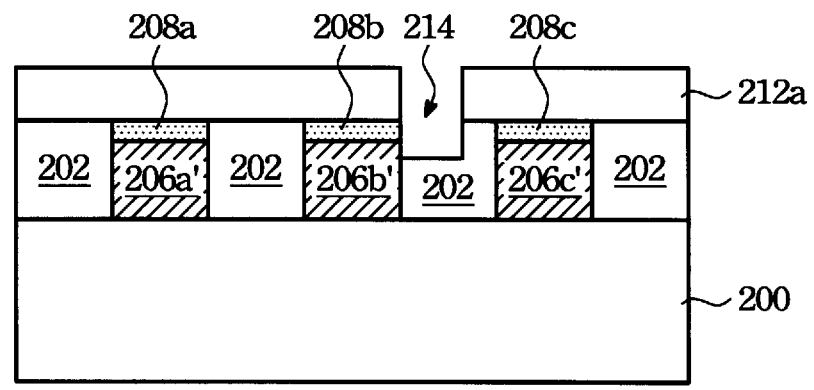
FIG. 3 is a cross sectional view of a semiconductor wafer illustrating the step of forming an opening in accordance with the prior art.
Figure 4:
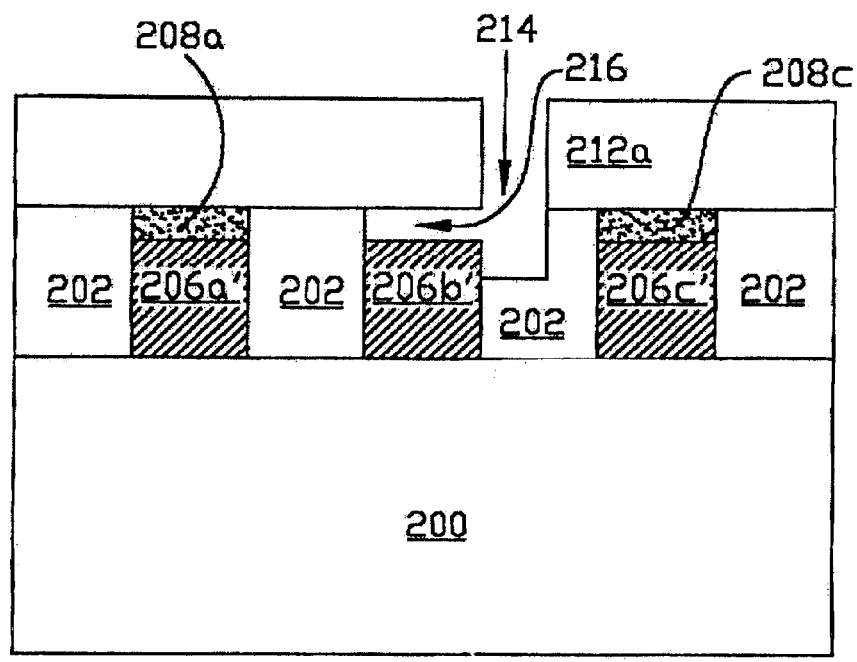
FIG. 4 is a cross sectional view of a semiconductor wafer illustrating the step of forming a lateral trench in accordance with the prior art.
Figure 5:
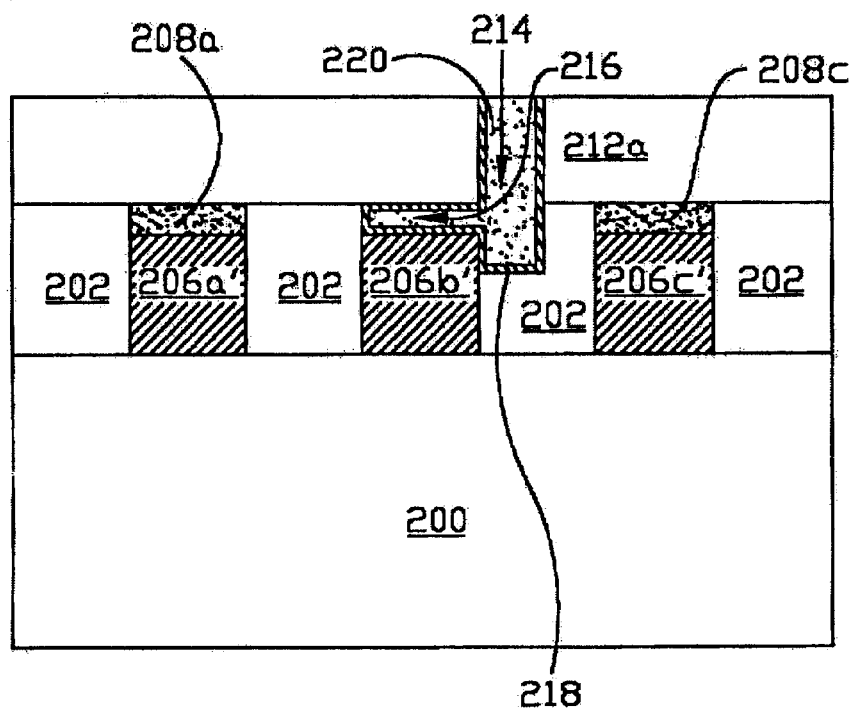
FIG. 5 is a cross sectional view of a semiconductor wafer illustrating the step of forming a conductive plug in accordance with the prior art.
Figure 6:
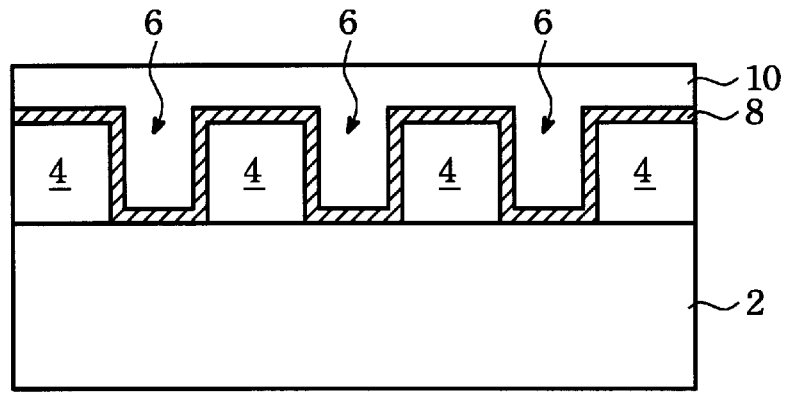
FIG. 6 is a cross sectional view of a semiconductor wafer illustrating the step of forming a sacrificial layer along a surface of trenches in accordance with the present invention.

As will be seen below, turning now to FIG. 6, a substrate 2 is provided, the substrate can be formed of silicon, GaAs, Ge and so on. For example, a single crystal silicon substrate 2 with a <100> crystallographic orientation is shown. Within the substrate 2 may be formed one or more semiconductor devices. The particular devices or their functions are not particularly germane to the present invention. However, the conductive structure for the devices are the subjects of the present invention.

An isolation layer 4 such as silicon oxide layer or silicon nitride layer is then formed on the surface of the substrate 2. The silicon oxide is typically formed by using any suitable oxide chemical compositions and procedures. The silicon nitride layer is deposited by any suitable process. For example, Low Pressure Chemical Vapor Deposition (LPCVD), Plasma Enhance Chemical Vapor Deposition (PECVD), High Density Plasma Chemical Vapor Deposition (HDPCVD). The thickness of the silicon nitride layer is about 1000 to 2000 angstroms. In the preferred embodiment, the reaction gases of the step to form silicon nitride layer include $SiH_4$, $NH_3$, $N_2$, $N_2O$ or $SiH_2Cl_2$, $NH_3$, $N_2$, $N_2O$. Next, the isolation layer 4 is patterned to define a plurality of trench 6 in the isolation layer 4.

Figure 7:
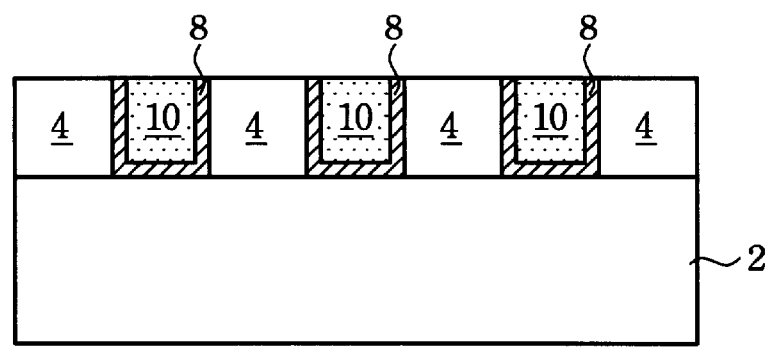
FIG. 7 is a cross sectional view of a semiconductor wafer illustrating the step of forming conductive structure in accordance with the present invention.

Then, wet clean process may be used to clean the substrate 2. The trenches 6 include a vertical surface and a horizontal surface. Next, a conformal sacrificial layer 8 is deposited along above etched surface. The material to form the sacrificial layer 8 is different from the isolation layer 4. Namely, the etching selectivity is quite different between the two materials under a certain etchant. A conductive layer 10 is formed over the sacrificial layer 8 and refilled into the trenches 6. Subsequently, the excess portion of the conductive layer 10 is removed by chemical mechanical polishing to the surface of the isolation layer 4, as shown in FIG. 7.

Figure 8:
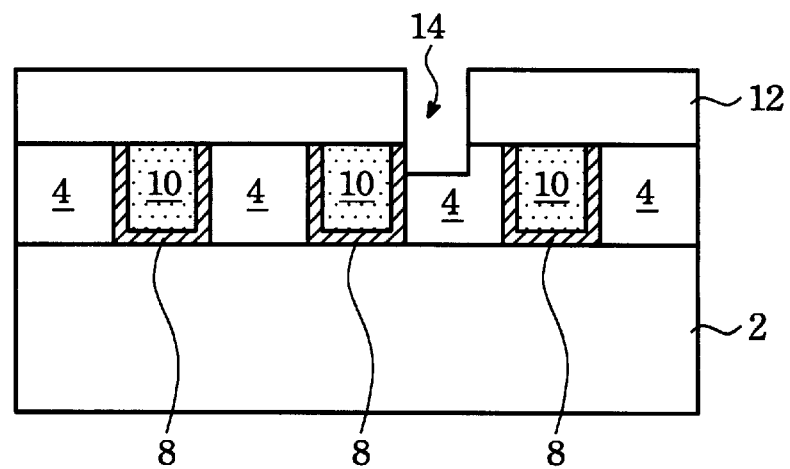
FIG. 8 is a cross sectional view of a semiconductor wafer illustrating the step of forming an opening in the second isolation layer in accordance with the present invention.

Please refer to FIG. 8, a further isolation layer 12 is formed over the polished surface. The subsequent step is to construct the dual damascene structure. As known in the art, plug formation is necessary for this step. Typically, lithography and etching technique is used to achieve the goal. However, misalignment may be occurred, thereby forming the opening that shifts to the conductive structure with a distance. For example, the opening may be formed adjacent to the conductive structure 10 or partially overlap with the conductive structure 10. It should be noted that the sacrificial layer 8 is exposed by the opening 14.

Figure 9:
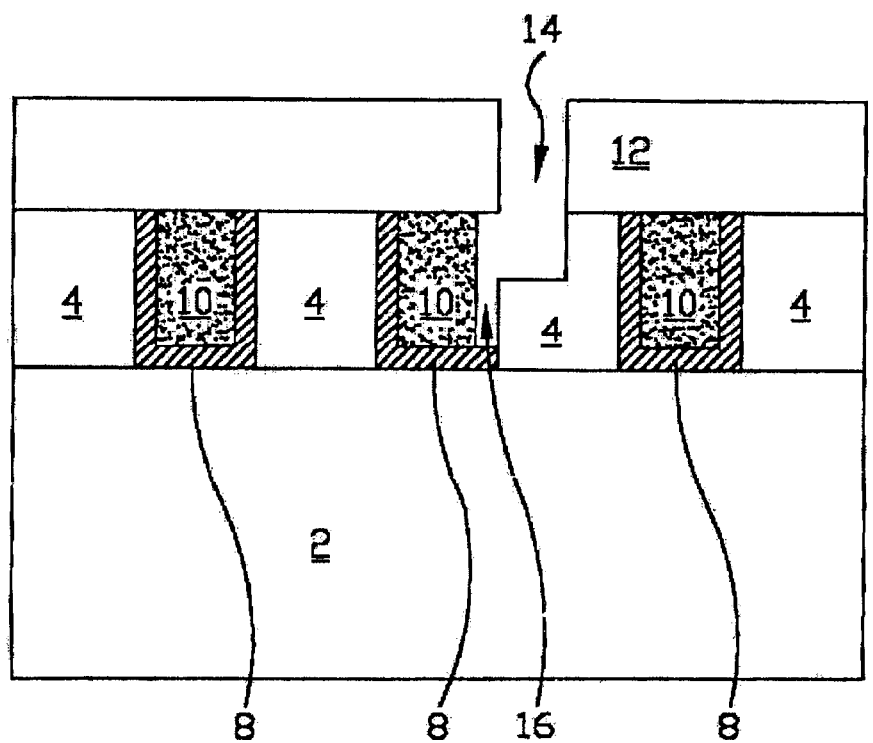
FIG. 9 is a cross sectional view of a semiconductor wafer illustrating the step of etching the sacrificial layer in accordance with the present invention.

Referring to FIG. 9, the isolation layer 12 is utilized as an etching mask to etch the sacrificial layer 8 attached on the side wall of the conductive structure 8 via the opening 14. In the preferred embodiment, if the sacrificial layer 8 is composed of nitride, then the hot phosphorus acide solution is used. Alternatively, the sacrificial layer 8 is oxide, the etchant is selected from HF or BOE (buffer oxide etching) solution. Thus, the sidewall of the conductive structure 10 is exposed by the vertical cavity 16.

Figure 10:
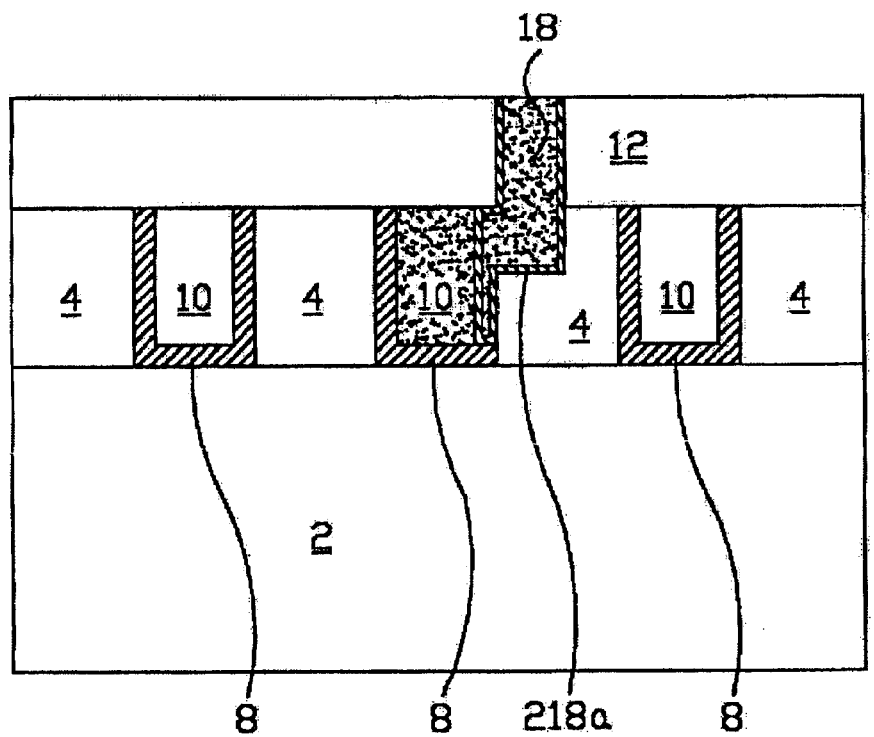
FIG. 10 is a cross sectional view of a semiconductor wafer illustrating the step of forming a conductive plug in accordance with the present invention.

Referring to FIG. 10, a conductive material 18 is then formed over the isolation layer 12 and refilled into the cavity 16 and the opening 14. Similarly, the conductive layer 18 is removed by chemical mechanical polishing for planarization. It can be understand from the illustration, the conductive material 18 is refilled into the cavity vertically, which is easier than the prior art. Further, lateral etching is omitted. If the conductive material includes tungsten, the glue/barrier layer 218a may be formed prior to the formation of tungsten. The glue/barrier material includes titanium/titanium nitride (Ti/TiN) or tantalum/tantalum nitride (Ta/taN). The tungsten exhibits the characteristic of good step coverage. The method may gain more contact surface to contact with the lower conductive structure, which greatly reduce contact resistance and increase the operation speed.

The dual damascene structure comprises a first isolation layer having a trench formed therein. A sacrificial layer is formed on a surface the trench and a first conductive material is formed in the trench, wherein at least a portion of a side wall of the first conductive material is exposed and attached by a second conductive material. A second isolation layer is formed on the first isolation layer to have an opening formed in the first and second isolation layers, wherein the opening at least exposes the second conductive material. A third conductive material is refilled into the opening and connected to the second material.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a dual damascene structure, said method comprising the steps of:

patterning a first isolation layer over a substrate;

forming a trench into said first isolation layer;

conformally forming a sacrificial layer along a surface of said patterned first isolation layer;

forming a conductive layer on said sacrificial layer;

removing a portion of said conductive layer, thereby forming a conducive structure in said trench;

forming a second isolation layer on said first isolation layer and said conductive layer;

forming an opening in said second isolation layer and said first isolation layer, wherein said opening at least exposes a portion of said sacrificial layer attached on side wall of said conductive structure;

removing said sacrificial layer attached on said side wall of said conductive structure via said opening, thereby forming a cavity adjacent to said conductive structure; and refilling a conductive material in said cavity and said opening, thereby connecting to said conductive structure.

2. The method of claim 1, wherein said sacrificial layer comprises oxide.

3. The method of claim 2, wherein said sacrificial layer is removed by HF solution.

4. The method of claim 2, wherein said sacrificial layer is removed by BOE solution.

5. The method of claim 2, wherein said sacrificial layer comprises nitride.

6. The method of claim 2, wherein said sacrificial layer is removed by hot phosphorus acid solution.

7. The method of claim 1, wherein said conductive material comprises tungsten.

8. The method of claim 7, further comprising forming glue and barrier layer before forming said conductive material.

* * * * *